United States Patent
Pang et al.

(10) Patent No.: US 8,013,444 B2
(45) Date of Patent: Sep. 6, 2011

(54) SOLDER JOINTS WITH ENHANCED ELECTROMIGRATION RESISTANCE

(75) Inventors: Mengzhi Pang, Phoenix, AZ (US); Pilin Liu, Chandler, AZ (US); Charavanakumara Gurumurthy, Higley, AZ (US)

(73) Assignee: Intel Corporation, Santa Clara, CA (US)

( * ) Notice: Subject to any disclaimer, the term of this patent is extended or adjusted under 35 U.S.C. 154(b) by 144 days.

(21) Appl. No.: 12/344,194

(22) Filed: Dec. 24, 2008

(65) Prior Publication Data

US 2010/0155947 A1    Jun. 24, 2010

(51) Int. Cl.
  *H01L 23/488* (2006.01)
  *B23K 1/00* (2006.01)
(52) U.S. Cl. ........... 257/741; 257/E23.023; 257/778; 257/738; 257/737; 257/734; 257/772; 257/782; 257/783; 257/779; 228/244
(58) Field of Classification Search .......... 257/741, 257/778, 738, 737, 734, 772, 782, 783, 779, 257/690, E23.023; 228/244
See application file for complete search history.

(56) References Cited

U.S. PATENT DOCUMENTS

| | | | | |
|---|---|---|---|---|
| 6,077,477 A * | 6/2000 | Sakai et al. | 420/560 |
| 6,265,767 B1 * | 7/2001 | Gaku et al. | 257/678 |
| 6,371,361 B1 * | 4/2002 | Yamaguchi et al. | 228/200 |
| 6,596,621 B1 * | 7/2003 | Copeland et al. | 438/614 |
| 6,998,336 B1 * | 2/2006 | Iba et al. | 438/612 |
| 7,224,067 B2 | 5/2007 | Suh | 257/772 |
| 7,335,269 B2 | 2/2008 | Leung | 148/400 |
| 7,338,567 B2 | 3/2008 | Munekata et al. | 148/400 |
| 7,538,429 B2 | 5/2009 | Nalla et al. | 257/737 |
| 2004/0078964 A1 * | 4/2004 | Itou et al. | 29/840 |
| 2004/0262779 A1 * | 12/2004 | Amagai et al. | 257/779 |
| 2005/0029666 A1 * | 2/2005 | Kurihara et al. | 257/772 |
| 2005/0218519 A1 * | 10/2005 | Koike et al. | 257/756 |
| 2006/0270233 A1 * | 11/2006 | Xia et al. | 438/690 |
| 2007/0042211 A1 * | 2/2007 | Love et al. | 428/548 |
| 2008/0242063 A1 | 10/2008 | Pang et al. | 438/499 |
| 2008/0264681 A1 * | 10/2008 | Iwai et al. | 174/257 |
| 2008/0292492 A1 * | 11/2008 | Ingham et al. | 420/561 |
| 2009/0232696 A1 * | 9/2009 | Ohnishi et al. | 420/561 |
| 2009/0301607 A1 * | 12/2009 | Nakano et al. | 148/24 |
| 2010/0155115 A1 | 6/2010 | Pang et al. | 174/257 |
| 2010/0233018 A1 * | 9/2010 | Yamada et al. | 420/561 |
| 2010/0243300 A1 * | 9/2010 | Amin et al. | 174/257 |
| 2010/0294565 A1 * | 11/2010 | Kawamata et al. | 174/94 R |
| 2010/0307823 A1 * | 12/2010 | Kawamata et al. | 174/84 R |

OTHER PUBLICATIONS

Chun Yu and Hao Lu, "*First-principles calculations of the effects of Cu and Ag additions on the electromigration of Sn-based solder*", J. Appl. Phys. 102, 054904 (2007).

Renavikar et al., "*Materials Technology for Environmentally Green Micro-electronic Packaging*", Intel Techn. Journal, 12[1], (Feb. 21, 2008), ISSN 1535-864X, DOI: 10.1535/itj.1201.01.

* cited by examiner

*Primary Examiner* — Alexander O Williams
(74) *Attorney, Agent, or Firm* — Konrad Raynes & Victor, LLP; Alan S. Raynes

(57) ABSTRACT

Electronic assemblies and solders used in electronic assemblies are described. One embodiment includes a die and a substrate, with a solder material positioned between the die and the substrate, the solder comprising at least 91 weight percent Sn, 0.4 to 1.0 weight percent Cu and at least one dopant selected from the group consisting of Ag, Bi, P, and Co. Other embodiments are described and claimed.

5 Claims, 1 Drawing Sheet

SOLDER JOINTS WITH ENHANCED ELECTROMIGRATION RESISTANCE

RELATED ART

Integrated circuits may be formed on semiconductor wafers made of materials such as silicon. The semiconductor wafers are processed to form various electronic devices. The wafers are diced into semiconductor chips (a chip is also known as a die), which may then be attached to a substrate using a variety of known methods. For example, bonding pads formed on the chip may be electrically coupled to the substrate using a variety of connection approaches, including, for example, those utilizing solder bumps.

In one type of die attach process, a die is mounted to a substrate using a conventional solder bump array in a flip chip configuration, using a method known as a C4 (controlled collapse chip connection) process, in which solder bumps are located between the die and substrate. In a C4 process, solder paste may be placed on pads on the active side of the die, on the substrate, or on both the die and substrate, using, for example, stencil mask printing. The solder is then melted and permitted to flow, to ensure that each bump fully wets the pad it was formed on. A die is positioned on the bumps, and a second reflow operation is then carried out, and a solder connection is made between the die pads and the substrate pads. A solder connection may also be made between the package substrate and a printed circuit board. Solder connections may be made between other components in an electronic assembly, including, but not limited to, between a die and a heat spreader.

Solder materials have traditionally included alloys of tin (Sn) and lead (Pb). Lead use is being phased out due to toxicity issues. As a result, lead free solder compositions have been developed.

BRIEF DESCRIPTION OF THE DRAWINGS

Embodiments are described by way of example, with reference to the accompanying drawings, which are not drawn to scale, wherein.

DETAILED DESCRIPTION

Certain embodiments relate to formation of electronic assemblies including solder connections between components.

Figure 1:
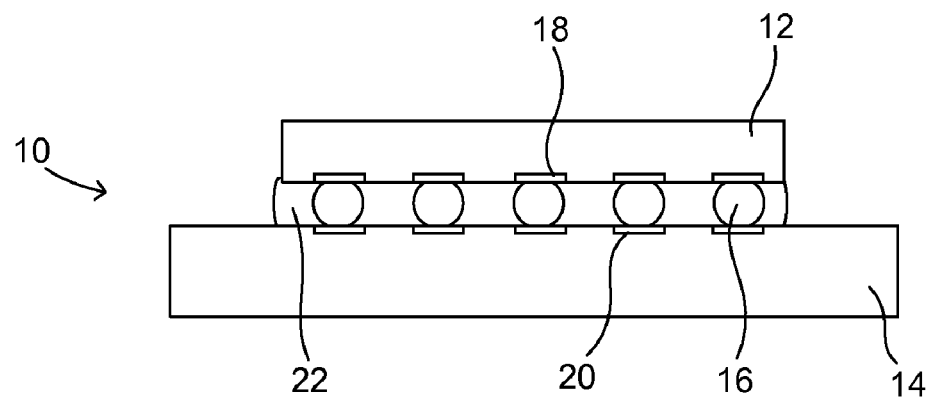
FIG. 1 illustrates a view of an electronic assembly including a die positioned on a substrate, with a solder material positioned between the die and substrate, in accordance with certain embodiments.

FIG. 1 illustrates an electronic assembly 10 in accordance with certain embodiments. The assembly includes a first level interconnect of a semiconductor die 12 coupled to a package substrate 14 by solder bumps 16. The die 12 and the substrate 14 may each include a plurality of bonding pads 18, 20, on which the solder bumps 16 are positioned. The bonding pads 18, 20 may be formed from a variety of materials including, but not limited to, nickel (Ni) and copper (Cu). The assembly 10 may also include an underfill material 22, typically a polymer, positioned between the die 12 and substrate 14.

During the coupling of the die to the substrate, stresses may develop in the die during the cool down process. If too high, these stresses can lead to failure in certain layers, such as the interlayer dielectric layers formed on the die. In addition, depending on the materials used, electromigration may occur in the solder joint during operation. Electromigration generally refers to solid state atomic movement because of momentum transfer from flowing electrons, may occur in the solder joint during operation, in particular, at high current densities. Such migration or movement of the metal may cause cracks, voids, solder joint separations, or other defects to form within the interconnect structure. Excessive electromigration may lead to joint failure.

As a result, the solder used for the first level interconnect should be sufficiently compliant so as to minimize stress transfer to the die, and also have suitable electromigration properties. The solder material may in certain embodiments be formed from a material comprising tin and copper including one or more dopants added to impart improved properties, including electromigration resistance.

Certain embodiments utilize a solder material having the general formula Sn0.7Cu+X, where X is one or more dopants selected from silver (Ag), bismuth (Bi), phosphorus (P) and cobalt (Co). A Sn0.7Cu solder generally includes about 99.3 weight percent tin and 0.7 weight percent copper. The additional dopant elements may be present in an amount of up to 2 weight percent each. Certain embodiments may include at least 91 weight percent Sn, 0.4 to 1.0 weight percent Cu, and up to 2 weight percent of one or more of Ag, Co, Bi and P.

Although not bound by particular mechanisms, certain aspects related to the proposed use of the dopants listed above will be discussed. It is believed that Ag doping can increase the energy barrier for Sn diffusion, which should help improve the electromigration properties of the tin based solder. It is also believed that Bi doping can help to reduce the solder joint interface defects due to its wettability with bonding pad materials such as Cu and Ni. It is also believed that P and Co doping may act to retard the growth of interfacial intermetallic compounds and in turn decrease void generation.

Various benefits may be obtained by using more than one of the dopants in the solder composition. Examples of embodiments utilizing Sn and Cu with only two of the dopants include compositions consisting of: (1) Sn, Cu, Ag and Co; (2) Sn, Cu, Ag and Bi; and (3) Sn, Cu, Bi, and Co. An example of a solder utilizing three of the dopants includes a composition consisting of Sn, Cu, Ag, Co, and Bi. In certain embodiments, the Co dopant may be present in an amount of 1-2 weight percent. In certain embodiments, the P dopant may be present in an amount of greater than 1 weight percent up to 2 weight percent. It is often very difficult or impossible to prevent some level of impurities from entering the solder composition. It should be appreciated that embodiments may include a small quantity (typically 0.1 weight percent or less) of such unavoidable impurities.

Embodiments also include methods for forming electronic devices including attaching a die to a substrate. Methods may include providing a solder material on at least one of a substrate and a die, the solder material comprising a composition in accordance with embodiments described above. One example includes a solder material comprising Sn, 0.4 to 1.0 weight percent Cu, and at least one dopant selected from the group consisting of Ag, Bi, P, Co. The solder material is heated to a temperature so that it reflows. The die is coupled to the substrate through the solder material. The solder material is solidified after the reflow. Certain embodiments, the die may be coupled to the substrate prior to the solder material being reflowed. In other embodiments, the die may be coupled to the substrate after the solder material has been reflowed.

Figure 2:
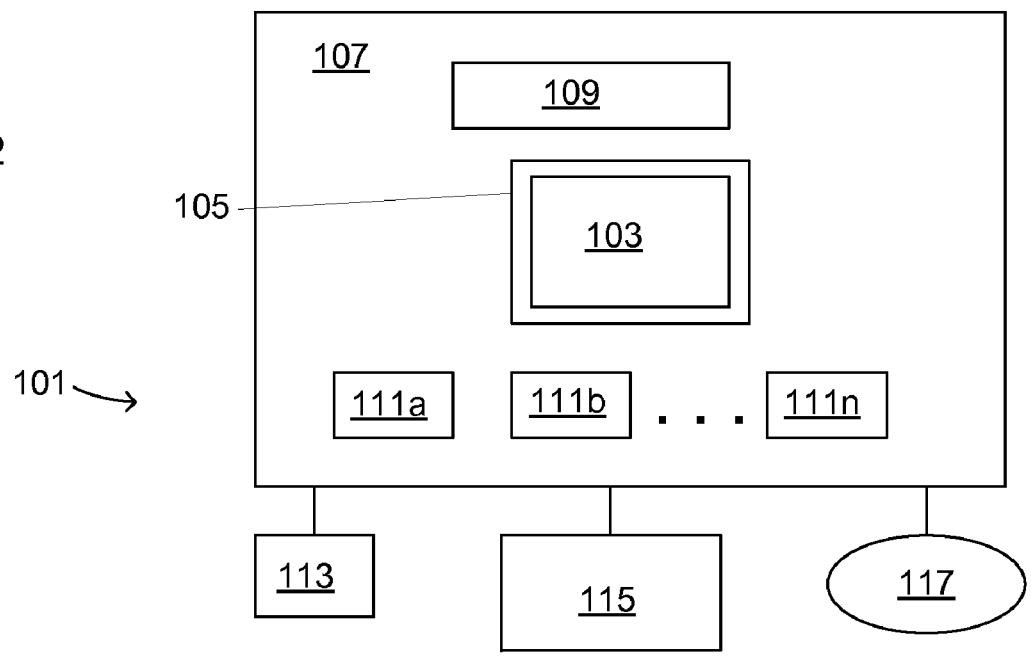
FIG. 2 illustrates an electronic system arrangement in which embodiments may find application.

Assemblies including a substrate and die joined together as described above may find application in a variety of electronic components. FIG. 2 schematically illustrates one example of an electronic system environment in which described embodiments may be embodied. Other embodiments need not include all of the features specified in FIG. 2, and may include alternative features not specified in FIG. 2.

The system 101 of FIG. 2 may include at least one central processing unit (CPU) 103. The CPU 103, also referred to as a microprocessor, may be a die which is attached to an integrated circuit package substrate 105, which is then coupled to a printed circuit board 107, which in this embodiment, may be a motherboard. The CPU 103 on the package substrate 105 is an example of an electronic device assembly that may be formed in accordance with embodiments such as described above. A variety of other system components, including, but not limited to memory and other components discussed below, may also include die and substrate structures formed in accordance with the embodiments described above.

The system 101 may further include memory 109 and one or more controllers 111a, 111b . . . 111n, which are also disposed on the motherboard 107. The motherboard 107 may be a single layer or multi layered board which has a plurality of conductive lines that provide communication between the circuits in the package 105 and other components mounted to the board 107. Alternatively, one or more of the CPU 103, memory 109 and controllers 111a, 111b . . . 111n may be disposed on other cards such as daughter cards or expansion cards. The CPU 103, memory 109 and controllers 111a, 111b . . . 111n may each be seated in individual sockets or may be connected directly to a printed circuit board. A display 115 may also be included.

Any suitable operating system and various applications execute on the CPU 103 and reside in the memory 109. The content residing in memory 109 may be cached in accordance with known caching techniques. Programs and data in memory 109 may be swapped into storage 113 as part of memory management operations. The system 101 may comprise any suitable computing device, including, but not limited to, a mainframe, server, personal computer, workstation, laptop, handheld computer, handheld gaming device, handheld entertainment device (for example, MP3 (moving picture experts group layer-3 audio) player), PDA (personal digital assistant) telephony device (wireless or wired), network appliance, virtualization device, storage controller, network controller, router, etc.

The controllers 111a, 111b . . . 111n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 113 in accordance with a storage protocol layer. The storage protocol of the layer may be any of a number of known storage protocols. Data being written to or read from the storage 113 may be cached in accordance with known caching techniques. A network controller can include one or more protocol layers to send and receive network packets to and from remote devices over a network 117. The network 117 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A device comprising:
   a semiconductor die;
   a substrate; and
   a solder material positioned between the die and the substrate, wherein the solder material consists of:
   0.4 to 1.0 weight percent Cu;
   greater than 0 and up to 2 weight percent Bi;
   greater than 0 and up to 2 weight percent Ag;
   1 to 2 weight percent Co; and
   the balance being at least 91 weight percent Sn and unavoidable impurities.

2. A device comprising:
   a semiconductor die;
   a substrate; and
   a solder material positioned between the die and the substrate, wherein the solder material consists of:
   0.4 to 1.0 weight percent Cu;
   greater than 0 and up to 2 weight percent Bi;
   1 to 2 weight percent Co; and
   the balance being at least 91 weight percent Sn and unavoidable impurities.

3. A device comprising:
   a semiconductor die;
   a substrate; and
   a solder material positioned between the die and the substrate wherein the solder material consists of:
   0.4 to 1.0 weight percent Cu;
   greater than 0 and up to 2 weight percent Bi;
   greater than 0 and up to 2 weight percent Ag;
   greater than 0 and up to 2 weight percent Co;
   1 to 2 weight percent P; and
   the balance being at least 91 weight percent Sn and unavoidable impurities.

4. A device comprising:
   a semiconductor die;
   a substrate; and
   a solder material positioned between the die and the substrate, wherein the solder material consists of:
   0.4 to 1.0 weight percent Cu;
   greater than 0 and up to 2 weight percent Ag;
   1 to 2 weight percent Co; and
   the balance being Sn and unavoidable impurities.

5. A device comprising:
   a semiconductor die;
   a substrate; and
   a solder material positioned between the die and the substrate, wherein the solder material consists of:
   0.4 to 1.0 weight percent Cu;
   1.0 to 2.0 weight percent Co; and
   the balance being Sn and unavoidable impurities.

* * * * *

UNITED STATES PATENT AND TRADEMARK OFFICE
CERTIFICATE OF CORRECTION

Page 1 of 1

PATENT NO.         : 8,013,444 B2
APPLICATION NO.    : 12/344194
DATED              : September 6, 2011
INVENTOR(S)        : M. Pang et al.

It is certified that error appears in the above-identified patent and that said Letters Patent is hereby corrected as shown below:

In the Claims

Column 4, lines 37-38, "substrate wherein" should read --substrate, wherein--.

Signed and Sealed this
Second Day of September, 2014

Michelle K. Lee
*Deputy Director of the United States Patent and Trademark Office*